United States Patent
Frei et al.

(10) Patent No.: US 9,531,328 B2
(45) Date of Patent: Dec. 27, 2016

(54) AMPLIFIERS WITH A SHORT PHASE PATH, PACKAGED RF DEVICES FOR USE THEREIN, AND METHODS OF MANUFACTURE THEREOF

(71) Applicant: FREESCALE SEMICONDUCTOR, INC., Austin, TX (US)

(72) Inventors: Jeffrey A. Frei, Hawthorn Woods, IL (US); Enver Krvavac, Lake Zurich, IL (US); Hussain H. Ladhani, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/572,136

(22) Filed: Dec. 16, 2014

(65) Prior Publication Data

US 2016/0173039 A1    Jun. 16, 2016

(51) Int. Cl.
| | | |
|---|---|---|
| H03F 3/191 | (2006.01) | |
| H03F 1/02 | (2006.01) | |
| H03F 3/21 | (2006.01) | |
| H03F 1/56 | (2006.01) | |
| H05K 13/04 | (2006.01) | |
| H01L 23/66 | (2006.01) | |
| H03F 3/193 | (2006.01) | |
| H03F 3/195 | (2006.01) | |
| H03F 3/217 | (2006.01) |

(52) U.S. Cl.
CPC ............ *H03F 1/0288* (2013.01); *H01L 23/66* (2013.01); *H03F 1/565* (2013.01); *H03F 3/193* (2013.01);
(Continued)

(58) Field of Classification Search
CPC ...... H03F 3/193; H03F 3/21; H03F 2200/451; H03F 2200/423; H03F 1/3247; H03F 1/193; H03F 3/04; H03F 1/0288; H03F 1/3205; H03F 1/565; H03F 3/265; H03F 3/211; H03F 2200/225; H03F 2200/391; H01L 23/49805; H01L 25/50; H01L 21/4853
(Continued)

(56) References Cited

U.S. PATENT DOCUMENTS

| | | |
|---|---|---|
| 5,095,285 A | 3/1992 | Khatibzadeh |
| 6,236,274 B1 | 5/2001 | Liu |

(Continued)

FOREIGN PATENT DOCUMENTS

WO    2009060264 A1    5/2009

OTHER PUBLICATIONS

Beltron, Ramon, A., "Class-F and Inverse Class-F Power Amplifier Loading Networks Design Based upon Transmission Zeros", IEEE MTT-S, Jun. 2014.*
(Continued)

*Primary Examiner* — Steven J Mottola
*Assistant Examiner* — Hafizur Rahman
(74) *Attorney, Agent, or Firm* — Sherry W. Schumm (57) ABSTRACT

An embodiment of a packaged radio frequency (RF) amplifier device includes a transistor and an inverse class-F circuit configured to harmonically terminate the device. The transistor has a control terminal and first and second current carrying terminals. The control terminal is coupled to an input lead of the device, and the first current carrying terminal is coupled to a voltage reference. The inverse class-F circuit is coupled between the second current carrying terminal and an output lead. The inverse class-F circuit includes a shunt circuit coupled between a cold point node and the voltage reference, where the cold point node corresponds to a second harmonic frequency cold point for the device. The shunt circuit adds a shunt negative susceptance at a fundamental frequency $F_0$ to the inverse class-F circuit.

18 Claims, 4 Drawing Sheets

(52) U.S. Cl.
CPC .............. *H03F 3/195* (2013.01); *H03F 3/211* (2013.01); *H03F 3/2171* (2013.01); *H05K 13/046* (2013.01); *H01L 2224/49175* (2013.01); *H01L 2924/0002* (2013.01); *H03F 2200/451* (2013.01); *H03F 2203/21106* (2013.01)

(58) Field of Classification Search
USPC .................. 307/105; 330/136, 277, 291, 295, 330/302–306
See application file for complete search history.

(56) References Cited

U.S. PATENT DOCUMENTS

| | | | |
|---|---|---|---|
| 7,521,995 | B1 | 4/2009 | Krvavac |
| 2007/0057731 | A1 | 3/2007 | Le |
| 2008/0231373 | A1* | 9/2008 | Rahman ................. H01L 23/66 330/302 |
| 2015/0123734 | A1* | 5/2015 | Donati ................... H03F 3/604 330/295 |

OTHER PUBLICATIONS

Data Sheet for PXAC201202FC, "Class-F and Inverse Class-F Power Amplifier Loading Networks Design Based upon Transmission Zeros", Infineon Technology AG, 85579 Neubiberg, Germany, Rev. 05, Aug. 25, 2014.*

J. Son, et al., A Highly Efficient Asymmetric Doherrty Power Amplifier With a New Output Combining Circuit, 2011 IEEE International Conference on Microwaves, Communications, Antennas and Electronics systems (COMCAS), Nov. 7-9, 2011, pp. 1-4.

X. Chen, et al., A High Linearity and Efficiency Doherty Power Amplifier for Retrodirective Communication, PIERS Online, vol. 4, No. 2, Feb. 2008, pp. 151-156.

D. Runton, et al., Doherty Power Amplifer Design, Feb. 2012, pp. 1-37.

* cited by examiner

AMPLIFIERS WITH A SHORT PHASE PATH, PACKAGED RF DEVICES FOR USE THEREIN, AND METHODS OF MANUFACTURE THEREOF

TECHNICAL FIELD

Embodiments of the subject matter described herein relate generally to amplifiers that include packaged semiconductor devices, and more particularly to packaged, high-power, radio frequency (RF) semiconductor devices.

BACKGROUND

In telecommunications systems that are designed to handle signals with high peak-to-average power ratios (PAPR), Doherty power amplifier architectures have become popular due to their relatively high linearity and efficiency at backoff levels, when compared with other types of amplifier topologies. A conventional two-way Doherty power amplifier includes a class-AB biased carrier amplifier and a class-C biased peaking amplifier in a parallel arrangement. When an input signal has relatively low to moderate power, the carrier amplifier operates to amplify the input signal, and the peaking amplifier is minimally contributing. Conversely, when an input signal has relatively high power, the input signal is split (e.g., using a 3- or other decibel (dB) quadrature coupler) between the carrier and peaking amplifier paths, both amplifiers operate to amplify their respective portion of the input signal, and the amplified signals are thereafter reactively combined to produce the final amplified output signal.

As the Doherty amplifier input signal level increases beyond the point at which the carrier amplifier is operating in compression, the peaking amplifier conduction also increases, thus supplying more current to the load. In response, the load impedance of the carrier amplifier output decreases. In fact, an impedance modulation effect occurs in which the load line of the carrier amplifier changes dynamically in response to the input signal (i.e., the peaking amplifier provides active load pulling to the carrier amplifier). An impedance inverter at the output of the carrier amplifier transforms the carrier amplifier output impedance to a high value, allowing the peaking amplifier to efficiently supply power to the load.

In many cases, the carrier amplifier is implemented in a packaged device that is coupled to a printed circuit board (PCB). In such a system, a portion of the impedance transformation and phase shift is performed within the packaged device, and a portion of the impedance transformation and phase shift is performed on the PCB. Using conventional designs, a significant amount of the impedance transformation is performed on the PCB, and the package plane impedance under Doherty impedance modulation conditions can become very low. Accordingly, the PCB is required to handle relatively high currents, and the design limit for overall RF bandwidth (RFBW) can become reduced. Generally, impedance transformation components implemented on the PCB tend to be more lossy than impedance transformation components implemented in the device. Because most of the losses on the PCB are $I^2R$ losses, the relatively high level of impedance transformation implemented on the PCB using conventional designs limits both achievable efficiency and RFBW of such designs.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Inverse class-F filter circuits have been used in some types of amplifier topologies to raise amplifier efficiency both at peak and backoff levels. However, conventional inverse class-F circuits add significant phase delays at the transistor output. The phase delays may not have deleterious effects in some amplifier topologies. However, the use of conventional inverse class-F structures in a Doherty amplifier topology may make the modulated impedance and phase characteristics of the amplifier become less optimal, thus limiting overall efficiency and RF bandwidth of the Doherty amplifier. This is particularly true because, along the carrier path of a Doherty amplifier, the specific trajectory of impedance transformation and accumulation of phase shift (e.g., from the intrinsic plane of a current source to the Doherty combiner summing node) has a large impact on the performance of the Doherty amplifier. A conventional inverse class-F circuit section may lower impedance at the fundamental frequency, $F_0$, and increase accumulated phase shift at the second harmonic ($2F_0$) cold point of the output circuit, especially under impedance modulation operation ("Zmod").

Embodiments of the inventive subject matter include amplifiers and packaged amplifier devices that may be used in Doherty amplifier topologies (e.g., in the carrier amplifier path of a Doherty amplifier). As will be described in more detail below, an embodiment of an amplifier includes an RF transistor having an output that is harmonically terminated with an embodiment of an inverse class-F filter circuit that includes a negative susceptance at the $2F_0$ cold point of the output circuit. The negative susceptance included in the inverse class-F filter circuit embodiment compensates for performance penalties that otherwise could occur when incorporating conventional inverse class-F harmonic termination circuitry in a Doherty amplifier topology. More specifically, the negative susceptance affects impedance and phase characteristics of the amplifier in a manner that may achieve improved Doherty amplifier performance (e.g., wider bandwidth, higher efficiency, reduced sensitivity, and/or improved amplifier compactness).

As will be described in more detail later, an inverse class-F filter circuit embodiment includes a series inductor (L1) from the output of the transistor to the $2F_0$ cold point, and a first shunt inductor-capacitor (LC) circuit from the $2F_0$ cold point to ground (or another voltage reference). The L1 value is chosen so that it resonates with the drain-source capacitance of the transistor at $2F_0$. Further, the first LC circuit is resonant at $2F_0$, and has a capacitive effect at frequencies below $2F_0$. Such a matching topology, without the additional negative susceptance mentioned above, may result in a very low package plane impedance, especially under Zmod. Accordingly, a significant amount of the impedance transformation would need to be performed on the PCB with increasing probable penalties. However, inclusion of the negative susceptance in accordance with an embodiment may significantly increase the package plane impedance, particularly under Zmod, thus reducing the amount of impedance transformation that is performed on the PCB. This may lead to a more efficient Doherty design, and potentially a more compact PCB.

Regarding the phase characteristics of the amplifier, the capacitive effect of the first LC circuit at frequencies below $2F_0$ has an associated positive shunt admittance, which may add a significant amount of phase shift to the inverse class-F filter circuit. By including the negative susceptance at the $2F_0$ cold point, according to an embodiment, the overall phase shift of the inverse class-F filter circuit may be reduced significantly, particularly under Zmod conditions. Accordingly, in addition to the other potential advantages described above, implementation of an inverse class-F filter circuit embodiment in a Doherty amplifier has an additional potential advantage of enabling a "short phase" (e.g., 90 degrees in total) carrier path between the transistor output and the Doherty summing node. A "short phase" carrier path may be particularly desirable because Doherty performance tends to be optimized at the center of the band of operation, and phase spreading over frequency impairs the Doherty performance. Accordingly, it is desirable to minimize the phase shift between the transistor output and the Doherty summing node, and thus to minimize the phase spreading. The inverse class-F filter circuit embodiments disclosed herein help to enable such a "short phase" carrier path.

Those of skill in the art would understand that the below described amplifier embodiments, and more specifically the below described inverse class-F filter circuit embodiments, may be used in other amplifier topologies besides Doherty amplifier topologies. In addition, in some designs, the inverse class-F filter circuit embodiments also may be used in a peaking path of a Doherty amplifier. Although such alternatives are not discussed in detail herein, embodiments that include such modifications are intended to fall within the scope of the inventive subject matter.

Figure 1:
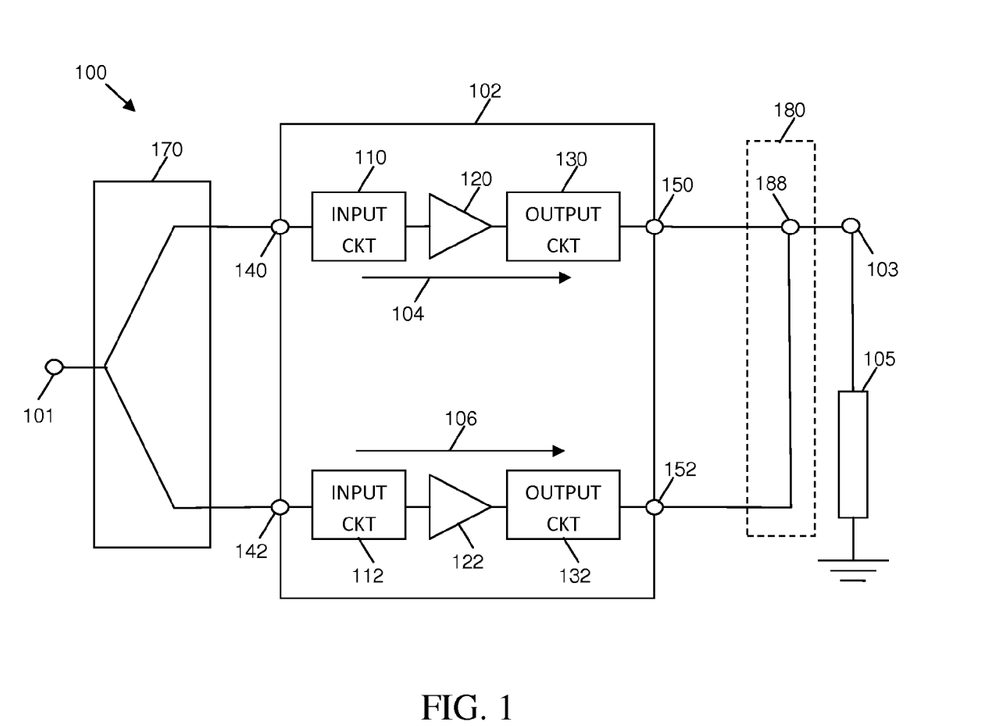
FIG. 1 is a simplified schematic diagram of a Doherty amplifier in which an embodiment of a packaged RF amplifier device may be incorporated.

FIG. 1 is a simplified schematic diagram of a Doherty amplifier 100 in accordance with an embodiment. More specifically, Doherty amplifier 100 includes multiple amplifier paths 104, 106, where at least one of the amplifier paths (e.g., amplifier path 104) includes an embodiment of an inverse class-F filter circuit. Although a two-way Doherty amplifier 100 is illustrated in FIG. 1 and described in detail herein, those of skill in the art would understand, based on the description herein, that embodiments of the inventive subject matter could be applied to amplifiers having more than two parallel amplification paths (e.g., a Doherty amplifier with a carrier amplifier path and more than one peaking amplifier paths).

Amplifier 100 includes an input node 101, an output node 103, an RF amplifier device 102, a power divider 170, and a power combiner 180, according to an embodiment. Essentially, an input signal received at input node 101 is amplified by amplifier 100 and provided to a load 105 (e.g., an antenna) via output node 103. As will be described in more detail below, the amplifier 100 is configured in a Doherty amplifier topology. Accordingly, the RF amplifier device 102 includes multiple amplifier paths, which include a carrier path 104 and one or more peaking paths 106, respectively.

Power divider 170 is coupled between input node 101 and input terminals 140, 142 to the RF amplifier device 102. Power divider 170 is configured to divide the input power of an input signal received at node 101 into multiple portions of the input signal, where respective portions of the input signal are provided to input terminals 140, 142. For example, a first output of the power divider 170 may be coupled to the input terminal 140 corresponding to the carrier path 104, and a second output of the power divider 170 may be coupled to the input terminal 142 corresponding to the peaking path 106. The power divider 170 may divide the input power equally among the amplifier paths 104, 106, such that roughly half of the input signal power is provided to each path 104, 106. Alternatively, the power divider 170 may divide the power unequally.

RF amplifier device 102 is a discretely packaged electrical component, which is coupled to a PCB that includes components of the amplifier 100 that are not contained within RF amplifier device 102. Accordingly, input and output terminals 140, 142, 150, 152 of RF amplifier device 102 represent the interface between the device 102 and amplifier components that are external to device 102. That interface is more commonly referred to as the "package plane" of the amplifier 100.

Within device 102, the carrier and peaking paths 104, 106 each includes an input impedance matching circuit (INPUT CKT) 110, 112, an amplifier stage 120, 122, and an output impedance matching circuit (OUTPUT CKT) 130, 132 coupled in series between input terminals 140, 142 and output terminals 150, 152. Each of the input impedance matching circuits 110, 112 is configured to provide a desired input impedance at its respective input terminal 140, 142 at the fundamental frequency (or carrier frequency), $F_0$, of the amplifier 100. Similarly, each of the output impedance matching circuits 130, 132 is configured to provide a desired output impedance at its respective output terminal 150, 152 at $F_0$. In an exemplary embodiment, the amplifier 100 is used to transmit RF signals, and $F_0$ is the frequency of transmittance.

One or both of the input impedance matching circuits 110, 112 may be realized as a low-pass impedance matching circuit (e.g., a shunt capacitance impedance matching circuit topology). In alternate embodiments, either or both of the input impedance matching circuits 110, 112 may be realized as a high-pass impedance matching circuit. As will be described in more detail below, the carrier-path output impedance matching circuit 130 includes an embodiment of an inverse class-F filter circuit. The peaking-path output impedance matching circuit 132 may be realized as a high-pass impedance matching circuit topology or as a low-pass impedance matching circuit topology, in various embodiments. The peaking-path output impedance matching circuit 132 has a different topology from the carrier-path output impedance matching circuit 130, in an embodiment, although they may have the same topology in other embodiments.

Given that amplifier 100 is a Doherty amplifier, amplifier stage 120 is biased to operate in class AB mode, and amplifier stage 122 is biased to operate in class C mode. More specifically the transistor arrangement of carrier amplifier stage 120 is biased to provide a conduction angle between 180 and 360 degrees. Conversely, the transistor arrangement of the peaking amplifier stage 122 is biased to provide a conduction angle less than 180 degrees. According to various embodiments, the amplifier stages 120, 122 may be asymmetrical (i.e., of different sizes) or symmetrical (i.e., substantially the same size).

Figure 3:
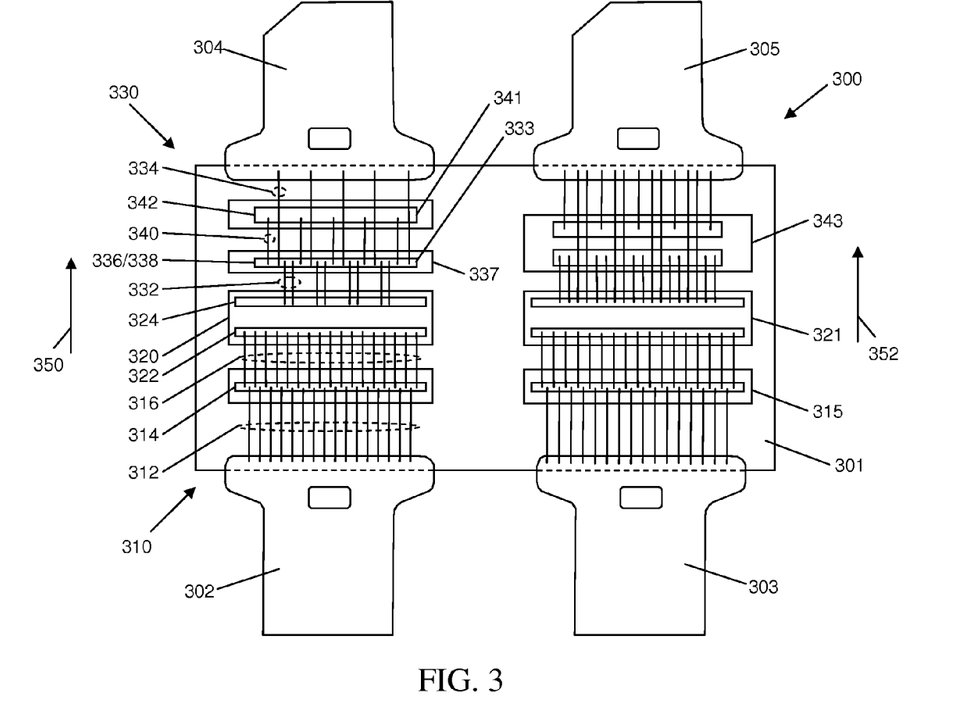
FIG. 3 is a top view of an RF amplifier device in which the carrier path circuitry of FIG. 2 is implemented, in accordance with an example embodiment.
Figure 5:
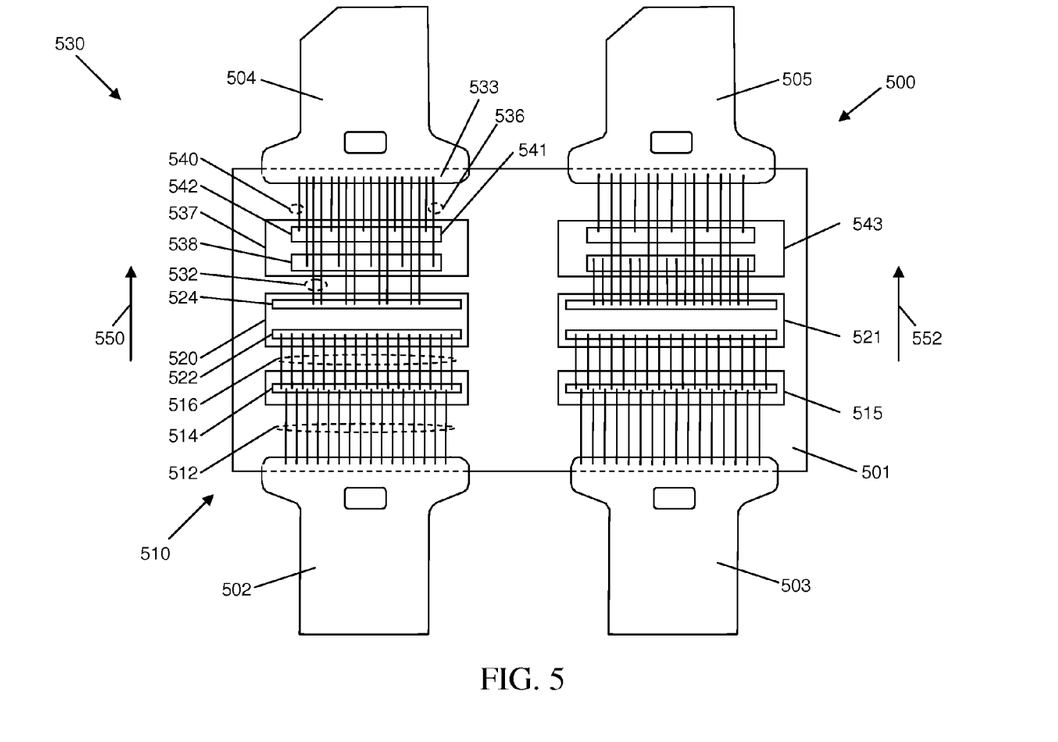
FIG. 5 is a top view of an RF amplifier device in which the carrier path circuitry of FIG. 4 is implemented, in accordance with an example embodiment.

In the illustrated embodiments, the multiple amplifier paths 104, 106 are contained within a single device package in which the input and output terminals 140, 142, 150, 152 provide external electronic connectivity to the device 102. More specifically, the input and output terminals 140, 142, 150, 152 generally represent the package leads, pins, or other physical interfaces for providing electrical connections to the internal components (e.g., amplifier paths 104, 106) of the RF amplifier device 102. Referring to later-described embodiments, for example, input terminals 140, 142 may correspond to input leads 302, 303, 502, 503 (FIGS. 3, 5), and output terminals 150, 152 may correspond to output leads 304, 305, 504, 505 (FIGS. 3, 5). In an alternate embodiment, the multiple amplifier paths 104, 106 may be contained in separate and distinct device packages.

Power combiner 180 is coupled between output terminals 150, 152 of the RF amplifier device 102 and output node 103. Power combiner 180 includes two inputs, a summing node 188, and an output that is coupled to the amplifier output 103. The output terminals 150, 152 each are coupled to an input to the power combiner 180, and thus to the summing node 188, which reactively combines amplified signals received from the amplifier paths 104, 106.

Power divider 170, RF amplifier device 102, and power combiner 180 are designed so that the total phase shifts applied along the amplifier paths 104, 106 ensure that the currents ultimately provided to summing node 188 by the respective amplifier paths 104, 106 are received substantially in-phase with each other. Accordingly, the current provided by summing node 188 to output node 103 (and to load 105) represents the in-phase summation of the currents provided by amplifier paths 104, 106.

It should be understood that FIG. 1 is a simplified representation of an amplifier 100 for purposes of explanation and ease of description, and that practical embodiments may include other devices and components to provide additional functions and features, and/or the amplifier 100 may be part of a much larger electrical system, as will be understood. Thus, although FIG. 1 depicts direct electrical connections between circuit elements and/or terminals, alternative embodiments may employ intervening circuit elements and/or components while functioning in a substantially similar manner.

Figure 2:
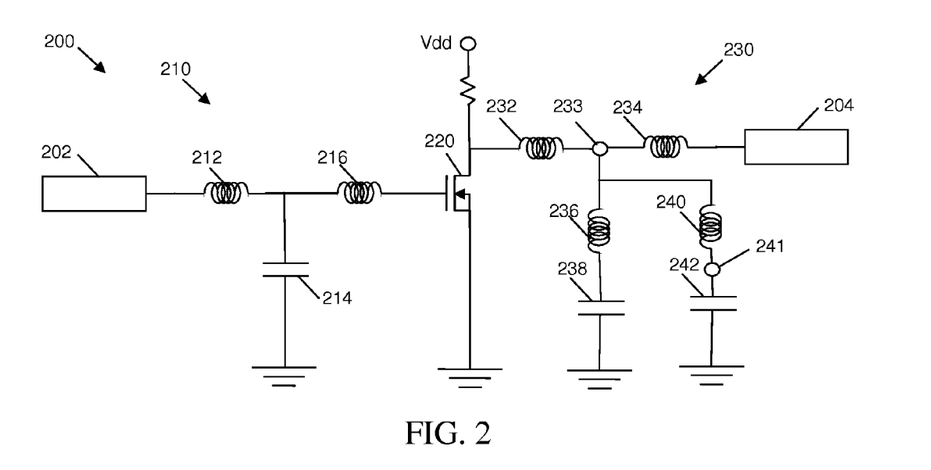
FIG. 2 is a schematic diagram of carrier path circuitry for a Doherty amplifier, in accordance with an example embodiment.

FIG. 2 is a schematic diagram of amplifier path circuitry 200, in accordance with an example embodiment. For example, amplifier path circuitry 200 may be used as carrier path circuitry within a Doherty amplifier, although circuitry 200 could be used as peaking path circuitry or in other types of amplifiers, as well. As a more specific example, amplifier path circuitry 200 may correspond to input terminal 140, input impedance matching circuit 110, amplifier stage 120, output impedance matching circuit 130, and output terminal 150 of the carrier path 104 of the RF amplifier device 102 included within the Doherty amplifier 100 of FIG. 1.

Amplifier path circuitry 200 includes an input lead 202, an input impedance matching circuit 210, a transistor 220, an output impedance matching circuit 230, and an output lead 204, in an embodiment. Although transistor 220 and various elements of the input and output impedance matching circuits 210, 230 are shown as singular components, the depiction is for the purpose of ease of explanation only. Those of skill in the art would understand, based on the description herein, that transistor 220 and/or certain elements of the input and output impedance matching circuits 210, 230 each may be implemented as multiple components (e.g., connected in parallel or in series with each other). The description of transistor 220 and various elements of the input and output impedance matching circuits 210, 230, below, thus is not intended to limit the scope of the inventive subject matter only to the illustrated embodiments.

Input lead 202 and output lead 204 each include a conductor or lead, which is configured to enable the amplifier path circuitry 200 to be electrically coupled with external circuitry (e.g., power divider 170 and power combiner 180, FIG. 1). More specifically, input and output leads 202, 204 are physically located between the exterior and the interior of the device's package, and correspond to the package plane. Input impedance matching circuit 210 is electrically coupled between the input lead 202 and a first terminal of transistor 220, which is also located within the device's interior, and output impedance matching circuit 230 is electrically coupled between a second terminal of transistor 220 and the output lead 204.

Transistor 220 is the primary active component of amplifier path circuitry 200. Transistor 220 includes a control terminal and two current conducting terminals, where the current conducting terminals are spatially and electrically separated by a variable-conductivity channel. For example, transistor 220 may be a field effect transistor (FET) (such as a metal oxide semiconductor FET (MOSFET), or more specifically a laterally diffused MOSFET (LDMOS)), or a heterostructure or modulation-doped FET (e.g., a high electron mobility transistor (HEMT)), each of which includes a gate (control terminal), a drain (a first current conducting terminal), and a source (a second current conducting terminal). Alternatively, transistor 220 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to FETs in a non-limiting manner, the gate of transistor 220 is coupled to the input impedance matching circuit 210, the drain of transistor 220 is coupled to the output impedance matching circuit 230, and the source of transistor 220 is coupled to ground (or another voltage reference). Through the variation of control signals provided to the gate of transistor 220, the current between the current conducting terminals of transistor 220 may be modulated. Transistor 220 is characterized by a drain-source capacitance, Cds. According to an embodiment, the Cds of transistor 220 is designed to shunt energy at the third harmonic frequency, $3F_0$ (i.e., Cds functions approximately as a short circuit, high admittance, or low impedance at $3F_0$).

Input impedance matching circuit 210 is coupled between the input lead 202 and the control terminal (e.g., gate) of the transistor 220. Input impedance matching circuit 210 is configured to reduce the impedance of amplifier path circuitry 200 from the impedance at the input lead 202 to a lower impedance level (e.g., in a range from about 2 to about 20 Ohms or higher) at the control terminal of transistor 220. According to an embodiment, input impedance matching circuit 210 includes two inductive elements 212, 216 (e.g., two sets of wirebonds) and a shunt capacitor 214. A first inductive element 212 (e.g., a first set of wirebonds) is coupled between input lead 202 and a first terminal of capacitor 214, and a second inductive element 216 (e.g., a second set of wirebonds) is coupled between the first terminal of capacitor 214 and the control terminal of transistor 220. The second terminal of capacitor 214 is coupled to ground (or another voltage reference).

The combination of inductive elements 212, 216 and shunt capacitor 214 functions as a low-pass filter. For example, according to an embodiment, the combination of inductive elements 212 and 216 may have a value in a range between about 50 picohenries (pH) to about 3 nanohenries (nH), and shunt capacitor 214 may have a value in a range between about 5 picofarads (pF) to about 80 pF. In other embodiments, the combination of inductive elements 212 and 216 and/or shunt capacitor 214 may have values larger or smaller than the above-given ranges.

Output impedance matching circuit 230 is coupled between the first current conducting terminal (e.g., drain) of transistor 220 and the output lead 204. Essentially, output impedance matching circuit 230 is an inverse class-F filter that is configured to raise the impedance of amplifier path circuitry 200 from the impedance at the first current conducting terminal of transistor 220 to a higher (e.g., intermediate) impedance level at output lead 204. As will be explained in more detail below, the impedance transformation achievable by output impedance matching circuit 230 is greater than impedance transformations achievable using conventional output impedance matching circuitry. This is advantageous in that it allows the PCB-level matching between the output lead 204 and the load (e.g., load 105, FIG. 1) to be smaller than it would be if the output impedance matching circuit 230 raised the impedance a lesser amount. For example, whereas conventional impedance matching circuit may be configured to raise the impedance at the output lead 204 to between about 1.0 and about 2.0 Ohms at Zmod, output impedance matching circuit 230 is configured to raise the impedance at the output lead 204 to between about 5.0 Ohms and about 15.0 Ohms at Zmod, in an embodiment. In other embodiments, output impedance matching circuit 230 may be configured to raise the impedance by lesser or greater amounts.

According to an embodiment, output impedance matching circuit 230 includes two series inductive elements 232, 234 coupled between the first current carrying terminal of the transistor 220 and the output lead 204, with a first node 233 between the two inductive elements 232, 234. As will be explained more fully below, the first node 233 corresponds to an RF cold point at the second harmonic frequency, $2F_0$. Further, the value for the first inductive element 232 is chosen so that it resonates at $2F_0$ with the drain-source capacitance, Cds, of transistor 220. Because the first node 233 corresponds to an RF cold point at $2F_0$, inductive element 232 creates a very high impedance at $2F_0$, as seen by the transistor 220.

Output impedance matching circuit 230 also includes a first shunt inductor-capacitor (LC) circuit coupled between the first node 233 and a voltage reference (e.g., ground), where the first shunt LC circuit includes a third inductive element 236 and a first capacitor 238 coupled in series. According to an embodiment, values for the third inductive element 236 and the first capacitor 238 are selected so that the first LC circuit is resonant at the second harmonic frequency, $2F_0$, thus rendering first node 233 an RF cold point at $2F_0$. Below $2F_0$, the first LC circuit has a capacitive effect.

According to an embodiment, output impedance matching circuit 230 also includes a second shunt LC circuit coupled between the first node 233 and the voltage reference, wherein the second shunt LC circuit includes a fourth inductive element 240 and a second capacitor 242 coupled in series. A second node 241 is present between the inductive and capacitive elements 240, 242, which corresponds to an RF cold point at the fundamental frequency, $F_0$. Values for the fourth inductive element 240 and the second capacitor 242 are selected so that the second shunt LC circuit resonates at a sub-fundamental frequency (i.e., a frequency that is lower than the fundamental frequency, $F_0$). Accordingly, the second shunt LC circuit presents a negative susceptance at $F_0$, applied to node 233.

As the above description sets forth, transistor 220 has an output that is harmonically terminated with an embodiment of an inverse class-F filter circuit (i.e., output impedance matching circuit 230) that includes an $F_0$ negative susceptance located at the $2F_0$ cold point of the circuit. This configuration for output impedance matching circuit 230 may significantly increase the impedance at the package plane (e.g., at lead 204), particularly under Zmod, when compared with conventional output impedance matching circuits. Accordingly, the amount of impedance transformation performed on the PCB may be significantly reduced. Thus, the efficiency of the amplifier may be increased, and the PCB may be made more compact. In addition, by including the negative susceptance at the $2F_0$ cold point, according to an embodiment, the overall phase shift of the inverse class-F filter circuit may be reduced significantly, particularly under Zmod, which opens the possibility for designing a short phase carrier path for a Doherty amplifier. Both support an increase in RFBW of the design.

The components corresponding to the amplifier path circuitry 200 may be incorporated into an overmolded or air-cavity RF device package, in various embodiments. As will be described in more detail below, additional components corresponding to additional signal paths also may be incorporated into the RF device. For example, the multiple signal paths may correspond to an amplifier in which separate RF input signals are provided to each of the multiple signal paths. For example, when the device forms a portion of a Doherty amplifier, the multiple signal paths may correspond to a carrier signal path (i.e., including a carrier amplifier) and one or more peaking signal paths (i.e., including one or more peaking amplifiers). Device embodiments described below correspond to devices that include two signal paths that receive separate RF input signals. Those of skill in the art would understand, based on the description herein, that other device embodiments may include components associated with a single signal path (e.g., only a carrier amplifier path), or more than two signal paths (e.g., a carrier amplifier path and more than two peaking amplifier paths). Such embodiments are intended to be included within the scope of the inventive subject matter.

FIG. 3 is a top view of an RF amplifier device 300 that embodies the amplifier path circuitry 200 of FIG. 2, in accordance with an example embodiment. More specifically, RF amplifier device 300 includes first circuitry associated with a first amplifier path 350, and second circuitry associated with a second amplifier path 352. The first amplifier path 350 may be a carrier path of a Doherty amplifier, and the second amplifier path 352 may be a peaking path of the Doherty amplifier, for example. In alternate embodiments, the amplifier paths 350, 352 form portions of a different type of amplifier. In another alternate embodiment, second circuitry associated with the second amplifier path 352 may be excluded from the device.

RF amplifier device 300 includes a device substrate 301, input leads 302, 303, output leads 304, 305, transistor die 320, 321, and passive components 314, 315, 336, 338, 342, 343 coupled to the top surface of the device substrate 301. In addition, device 300 includes multiple sets of wirebonds 312, 316, 332, 334, 340 that electrically interconnect the leads, 302-305, die 320, 321, and components 314, 315, 336, 338, 342, 343. Each set of wirebonds 312, 316, 332, 334, 340 is formed from a plurality of parallel, closely-spaced bonding wires. Although certain numbers and arrangements of wirebonds 312, 316, 332, 334, 340 are depicted in FIG. 3, the numbers and/or arrangements of wirebonds may be different from that illustrated. Further, each set of wirebonds 312, 316, 332, 334, 340 constitutes an inductive element, and therefore the wirebonds may be referred to below as "inductive elements" rather than "wirebonds."

In an overmolded package embodiment, the device 300 also includes non-conductive molding compound (or encapsulant) over the top surface of the device substrate 301, which encompasses the transistor die 320, 321, passive components 314, 315, 336, 338, 342, 343, the inductive elements 312, 316, 332, 334, 340, and portions of the input and output leads 302-305. In an air-cavity package embodiment, the device also includes one or more isolation structures and a lid, where the isolation structure(s) electrically isolate the leads 302-305 from the substrate 301, and the lid seals the components within the air cavity. To facilitate depiction of the circuitry associated with the amplifier paths 350, 352, molding compound (for an overmolded package) and a lid (for an air-cavity package) are not depicted in FIG. 3, as the molding compound or lid would overlie and obscure the circuitry within the package. Further, various structural components that may be included within the package (e.g., isolation structures, and so on) are not depicted.

The device substrate 301 includes one or more rigid materials with an electrically conductive top surface. For example, the substrate 301 may be formed from a solid conductive material (e.g., a solid copper flange) or from a plurality of conductive and non-conductive layers (e.g., from printed circuit board materials with conductive layers). In the latter embodiment, the layer corresponding to the top surface of the device substrate 301 is a conductive layer. In whichever embodiment, the conductive top surface of the substrate 301 (or the substrate 301 itself) provides a voltage reference plane for the device (e.g., a ground plane) when the device 300 is incorporated into a larger electrical system (e.g., attached to a PCB which includes addition portions of an amplifier system).

Device substrate 301 has a thickness that is sufficient to provide structural support for other components and elements of the device 300. In addition, substrate 301 may function as a heat sink for the active die 320, 321 and other components mounted on substrate 301.

As mentioned above, transistor die 320, 321 and passive components 314, 315, 336, 338, 342, 343 are coupled to the top surface of the device substrate 301 (e.g., with solder, conductive epoxy, or other means), and inductive elements 312, 316, 332, 334, 340 (e.g., sets of wirebonds) electrically couple the leads 302-305 and the various die and components. The die 320, passive components 314, 336, 338, 342, and inductive elements 312, 316, 332, 334, 340 associated with the first amplifier path 350 will be discussed in detail herein, as these elements correspond to elements of the amplifier path 200 depicted in FIG. 2 (e.g., to a carrier amplifier path). The die 321, passive components 315, 343, and inductive elements associated with the second amplifier path 352 will not be discussed in detail below. Those of skill in the art would understand that the second amplifier path 352 may have any of a number of different configurations. According to an embodiment, the configuration of the second amplifier path 352 is different from the configuration of the first amplifier path 350, and such differences are outside of the scope of the present application. In an alternate embodiment, the configuration of the second amplifier path 352 may be substantially the same as the configuration of the first amplifier path 350.

In any event, the first amplifier path 350 includes input lead 302 (e.g., input lead 202, FIG. 2), an input impedance matching circuit 310 (e.g., input impedance matching circuit 210, FIG. 2), a transistor die 320 (e.g., transistor 220, FIG. 2), an output impedance matching circuit 330 (e.g., output impedance matching circuit 230, FIG. 2), and an output lead 304 (e.g., output lead 204, FIG. 2). Leads 302, 304 are electrically isolated from substrate 301 (e.g., by encapsulant or isolation structure(s)), and thus are electrically isolated from the voltage reference provided by substrate 301.

Input impedance matching circuit 310 includes a first inductive element 312 (e.g., inductive element 212, FIG. 2), a discrete capacitor 314 (e.g., capacitor 214, FIG. 2), and a second inductive element 316 (e.g., inductive element 216, FIG. 2), in an embodiment. The first inductive element 312 is implemented in the form of a plurality of wirebonds, which electrically connect input lead 302 to capacitor 314. Capacitor 314 is implemented as a discrete component, in an embodiment. For example, capacitor 314 may be an integrated passive device (IPD) that includes at least one metal-insulator-metal (MIM) capacitor, a metal-oxide-semiconductor capacitor (MOSCAP), a discrete ceramic capacitor, or another type of capacitor.

A first electrode of capacitor 314 is coupled to a conductive contact on the top surface of capacitor 314, and a second electrode of capacitor 314 is coupled to a conductive contact on the bottom surface of capacitor 314. The first inductive element 312 is coupled to the first electrode of capacitor 314 through the conductive top contact, and the second electrode of capacitor 314 is electrically coupled to the voltage reference provided by the substrate 301 (e.g., the second electrode is grounded through the substrate 301).

According to an embodiment, the second inductive element 316 also is implemented in the form of a plurality of wirebonds, which electrically connects the first electrode of capacitor 314 to transistor die 320 (or more particularly to the control terminal of transistor die 320). In an alternate embodiment, at least a portion of the second inductive element 316 may be implemented as an IPD (which may also include the capacitor 314). In another alternate embodiment, capacitor 314 and inductive element 316 may be included in the transistor die 320.

Transistor die 320 includes one or more transistors formed in and over a surface of a semiconductor substrate (e.g., a silicon, silicon-on-insulator, silicon-on-sapphire, gallium nitride, gallium arsenide, or other type of substrate). For example, transistor die 320 may be a FET (e.g., a MOSFET, such as an LDMOS transistor, a HEMT, and so on), or a BJT. Generally, transistor die 320 includes a control terminal (e.g., a gate), a first current conducting terminal (e.g., a drain), and a second current conducting terminal (e.g., a source). For convenience, the control terminal and current conducting terminals will be referred to as "gate," "drain," and "source" in the description below, although the use of those terms is not meant to be limiting.

In any event, the transistor gate is electrically coupled to a gate terminal (e.g., gate terminal 322) at a top surface of the transistor die 320, and the transistor drain is electrically coupled to a drain terminal (e.g., drain terminal 324) at a top surface of the transistor die 320. According to an embodiment, the transistor(s) embodied in transistor die 320 are vertical transistors. Accordingly, the source(s) are electrically coupled to a source terminal (not shown in FIG. 3) at a bottom surface of the transistor die 320. The source terminal, in turn, is electrically coupled to the top surface of substrate 301. Accordingly, the source terminal is electrically coupled to the voltage reference provided by the substrate 301 (e.g., the source is grounded through the substrate 301). Those of skill in the art would understand, based on the description herein, that the "source" and the "drain" terminals essentially are current conducting terminals, and that they may be interchanged in an alternate embodiment.

According to an embodiment, output impedance matching circuit 330 is an inverse class-F filter circuit that includes an $F_0$ negative susceptance located at the $2F_0$ cold point of the device 300. More specifically, output impedance matching circuit 330 includes a first inductive element 332 (e.g., inductive element 232, FIG. 2), a first node 333 (e.g., node 233, FIG. 2) corresponding to the $2F_0$ cold point, a first LC circuit that includes a second inductive element 336 (e.g., inductive element 236, FIG. 2) and a first capacitor 338 (e.g., capacitor 238, FIG. 2) coupled in series and implemented in a first discrete component 337, a second LC circuit that includes a third inductive element 340 (e.g., inductive element 240, FIG. 2) and a second capacitor 342 (e.g., capacitor 242, FIG. 2) coupled in series, and a second node 341 (e.g., node 241, FIG. 2) corresponding to an $F_0$ cold point of the device 300. In addition, device 300 includes a fourth inductive element 334 (e.g., inductive element 234, FIG. 2) in the form of a plurality of wirebonds, which essentially are used to convey the signals amplified within device 300 to the output lead 304.

The first inductive element 332 is implemented in the form of a plurality of wirebonds, which electrically connect drain terminal 324 of transistor die 320 to the first node 333, or the $2F_0$ cold point of the device 300. As explained in detail in conjunction with FIG. 2, both the first and second LC circuits are coupled between the $2F_0$ cold point (i.e., first node 333) and the voltage reference of the device (e.g., the substrate 301).

According to an embodiment, the first LC circuit (i.e., the series combination of the second inductive element 336 and capacitor 338) is integrated with the first discrete component 337. For example, the first discrete component 337 may be an IPD, which includes the second inductive element 336 and the first capacitor 338 coupled in series. More specifically, within the first discrete component 337, a first terminal of the inductive element 336 is coupled to a conductive contact on the top surface of the component 337 (or the $2F_0$ cold point corresponding to first node 333), and a second terminal of the inductive element 336 is coupled to a first electrode of capacitor 338. A second electrode of capacitor 338 is coupled to a conductive contact on the bottom surface of the component 337. Accordingly, the second electrode of capacitor 338 is electrically coupled to the voltage reference provided by the substrate 301 (e.g., the first LC circuit is grounded through the substrate 301).

According to an embodiment, the second LC circuit (i.e., the series combination of the third inductive element 340 and the second capacitor 342) also is coupled to the $2F_0$ cold point corresponding to first node 333. The third inductive element 340 is implemented in the form of a plurality of wirebonds, which electrically connects node 333 to the second capacitor 342. Capacitor 342 may be an IPD, a MOSCAP, a discrete ceramic capacitor, or another type of capacitor, in various embodiments.

A first electrode of capacitor 342 is coupled to a conductive contact on the top surface of capacitor 342, and a second electrode of capacitor 342 is coupled to a conductive contact on the bottom surface of capacitor 342. The third inductive element 340 is coupled to the first electrode of capacitor 342 through the conductive top contact, and the second electrode of capacitor 342 is electrically coupled to the voltage reference provided by the substrate 301 (e.g., the second electrode is grounded through the substrate 301). As mentioned above, the conductive contact on the top surface of capacitor 342 corresponds to node 341, or to an $F_0$ cold point of the device 300. Finally, the fourth inductive element 334 also is implemented in the form of a plurality of wirebonds, which electrically connects node 333 to the output lead 304.

Although the details of the second amplifier path 352 are not discussed in detail herein, it can be noted that the second amplifier path also includes an input impedance matching circuit (e.g., including capacitor 315 and sets of wirebonds, not labeled, between input lead 303, capacitor 315, and transistor die 321), a transistor die 321, and an output impedance matching circuit (e.g., including IPD 343 with one or a plurality of integrated capacitors, and sets of wirebonds, not labeled, between transistor die 321, IPD 343, and output lead 305). According to an embodiment, the first and second transistor die 320, 321 are asymmetrical (i.e., having a different size and/or periphery), making the device 300 particularly suitable for incorporation into an asymmetrical Doherty amplifier. In another embodiment, the first and second transistor die 320, 321 may be symmetrical (i.e., having substantially the same size and/or periphery), making device 300 particularly suitable for incorporation into a symmetrical Doherty amplifier. The second amplifier path 352 and its associated input and output impedance matching circuits may have any of a number of configurations, only one of which is illustrated in FIG. 3.

Figure 4:
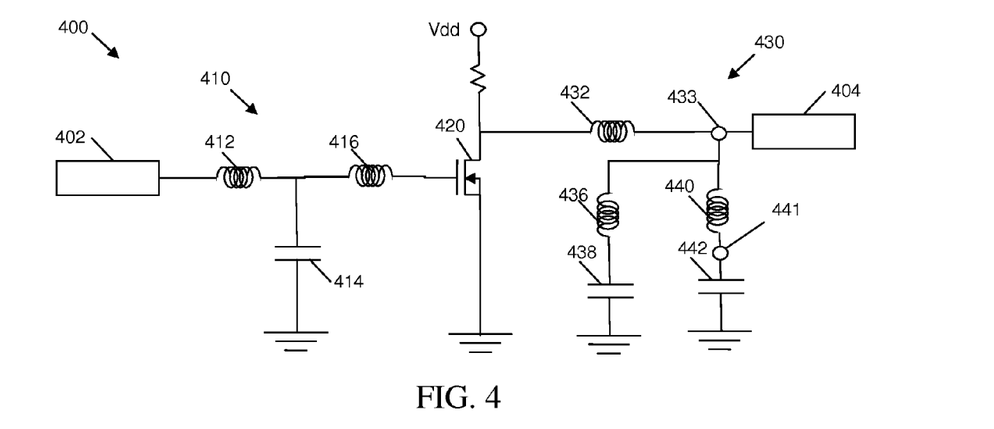
FIG. 4 is a schematic diagram of carrier path circuitry for a Doherty amplifier, in accordance with another example embodiment.

Another embodiment of amplifier path circuitry and an associated RF amplifier device that includes a differently configured output impedance matching circuit will now be described in conjunction with FIGS. 4 and 5. Many of the aspects of the amplifier path circuitry and RF amplifier device described in conjunction with FIGS. 4 and 5 are similar to analogous aspects of the amplifier path circuitry and RF amplifier device described in conjunction with FIGS. 2 and 3. For the purpose of brevity, those analogous aspects will not be discussed in detail below. It is to be understood that many of the details and various embodiments discussed above in conjunction with FIGS. 2 and 3 apply equally to the embodiments of FIGS. 4 and 5.

FIG. 4 is a schematic diagram of amplifier path circuitry 400 (e.g., carrier path circuitry), in accordance with another example embodiment. Amplifier path circuitry 400 includes an input lead 402, an input impedance matching circuit 410, a transistor 420, an output impedance matching circuit 430, and an output lead 404, in an embodiment. Input lead 402 and output lead 404 each include a conductor or lead, which is configured to enable the amplifier path circuitry 400 to be electrically coupled with external circuitry (e.g., power divider 170 and power combiner 180, FIG. 1). Input impedance matching circuit 410 is electrically coupled between the input lead 402 and a first terminal of transistor 420, and output impedance matching circuit 430 is electrically coupled between a second terminal of transistor 420 and the output lead 404.

Transistor 420, which is the primary active component of amplifier path circuitry 400, includes a control terminal and two current conducting terminals. The control terminal (e.g., gate) of transistor 420 is coupled to the input impedance matching circuit 410, the first current conducting terminal (e.g., the drain) of transistor 420 is coupled to the output impedance matching circuit 430, and the second current conducting terminal (e.g., the source) of transistor 420 is coupled to ground (or another voltage reference).

Input impedance matching circuit 410 is coupled between the input lead 402 and the control terminal (e.g., gate) of the transistor 420. According to an embodiment, input impedance matching circuit 410 includes two inductive elements 412, 416 (e.g., two sets of wirebonds) and a shunt capacitor 414. A first inductive element 412 (e.g., a first set of wirebonds) is coupled between input lead 402 and a first terminal of capacitor 414, and a second inductive element 416 (e.g., a second set of wirebonds) is coupled between the first terminal of capacitor 414 and the control terminal of transistor 420. The second terminal of capacitor 414 is coupled to ground (or another voltage reference).

Output impedance matching circuit 430 is coupled between the first current conducting terminal (e.g., drain) of transistor 420 and the output lead 404. As with the embodiment of FIG. 2, output impedance matching circuit 430 is an inverse class-F filter that is configured to raise the impedance of amplifier path circuitry 400 from the impedance at the first current conducting terminal of transistor 420 to a higher (e.g., intermediate) impedance level at output lead 404. According to an embodiment, output impedance matching circuit 430 includes a series inductive element 432 coupled between the first current carrying terminal of the transistor 420 and the output lead 404, with the point at which the series inductive element 432 is connected to the output lead 404 corresponding to a first node 433. According to an embodiment, the first node 433 corresponds to an RF cold point at the second harmonic frequency, $2F_0$. Further, the value for the series inductive element 432 is chosen so that it resonates at $2F_0$ with the drain-source capacitance, Cds, of transistor 420. Because the first node 433 corresponds to an RF cold point at $2F_0$, inductive element 432 creates a very high impedance at $2F_0$, as seen by the transistor 420.

Output impedance matching circuit 430 also includes a first shunt inductor-capacitor (LC) circuit coupled between the first node 433 and a voltage reference (e.g., ground), where the first shunt LC circuit includes a second inductive element 436 and a first capacitor 438 coupled in series. According to an embodiment, values for the second inductive element 436 and the first capacitor 438 are selected so that the first LC circuit is resonant at the second harmonic frequency, $2F_0$, thus rendering first node 433 the RF cold point at $2F_0$. Below $2F_0$, the first LC circuit has a capacitive effect.

According to an embodiment, output impedance matching circuit 430 also includes a second shunt LC circuit coupled between the first node 433 and the voltage reference, wherein the second shunt LC circuit includes a third inductive element 440 and a second capacitor 442 coupled in series. A second node 441 is present between the inductive and capacitive elements 440, 442, which corresponds to an RF cold point at the fundamental frequency, $F_0$. According to an embodiment, values for the fourth inductive element 440 and the second capacitor 442 are selected so that the second shunt LC circuit resonates at a sub-fundamental frequency (i.e., a frequency that is lower than the fundamental frequency, $F_0$). Accordingly, the second shunt LC circuit presents a negative susceptance at $F_0$. According to an embodiment, the sub-fundamental frequency at which the second shunt LC circuit resonates is below the fundamental frequency $F_0$ such that, at the fundamental frequency $F_0$, an appropriate value of negative susceptance is developed at the $2F_0$ cold point, whereby maximum impedance and phase benefits are applied to the circuit.

As the above description sets forth, transistor 420 has an output that is harmonically terminated with an embodiment of an inverse class-F filter circuit (i.e., output impedance matching circuit 430) that includes a negative susceptance at the $2F_0$ cold point of the circuit. As with the circuit of FIG. 2, this configuration for output impedance matching circuit 430 may significantly increase the impedance at the package plane (e.g., at lead 404), particularly under Zmod, when compared with conventional output impedance matching circuits. In addition, by including the negative susceptance at the $2F_0$ cold point, according to an embodiment, the overall phase shift of the inverse class-F filter circuit may be reduced significantly, particularly under Zmod.

FIG. 5 is a top view of an RF amplifier device 500 that embodies the amplifier path circuitry 400 of FIG. 4, in accordance with an example embodiment. More specifically, RF amplifier device 500 includes first circuitry associated with a first amplifier path 550, and second circuitry associated with a second amplifier path 552. The first amplifier path 550 may be a carrier path of a Doherty amplifier, and the second amplifier path 552 may be a peaking path of the Doherty amplifier, for example. In alternate embodiments, the amplifier paths 550, 552 form portions of a different type of amplifier. In another alternate embodiment, second circuitry associated with the second amplifier path 552 may be excluded from the device.

RF amplifier device 500 includes a device substrate 501, input leads 502, 503, output leads 504, 505, transistor die 520, 521, and passive components 514, 515, 538, 542, 543 coupled to the top surface of the device substrate 501. The device substrate 501 has an electrically conductive top surface, which may be used to provide a voltage reference plane for the device (e.g., a ground plane) when the device 500 is incorporated into a larger electrical system. In addition, device 500 includes multiple sets of wirebonds 512, 516, 532, 536, 540 that electrically interconnect the leads, 502-505, die 520, 521, and components 514, 515, 538, 542, 543. Device 500 may be implemented in an overmolded or air-cavity package, in different embodiments.

The die 520, passive components 514, 538, 542, and inductive elements 512, 516, 532, 536, 540 associated with the first amplifier path 550 will be discussed in detail herein, as these elements correspond to elements of the amplifier path 400 depicted in FIG. 4 (e.g., to a carrier amplifier path). The die 521, passive components 515, 543, and inductive elements associated with the second amplifier path 552 will not be discussed in detail below.

In any event, the first amplifier path 550 includes input lead 502 (e.g., input lead 402, FIG. 4), an input impedance matching circuit 510 (e.g., input impedance matching circuit 410, FIG. 4), a transistor die 520 (e.g., transistor 420, FIG. 4), an output impedance matching circuit 530 (e.g., output impedance matching circuit 430, FIG. 4), and an output lead 504 (e.g., output lead 404, FIG. 4).

Input impedance matching circuit 510 includes a first inductive element 512 (e.g., inductive element 412, FIG. 4), a discrete capacitor 514 (e.g., capacitor 414, FIG. 4), and a second inductive element 516 (e.g., inductive element 416, FIG. 4), in an embodiment, each of which may be substantially similar to analogous components in the device 300 of FIG. 3. Similarly, transistor die 520 may be substantially similar to transistor die 320 of FIG. 3.

According to an embodiment, output impedance matching circuit 530 is an inverse class-F filter circuit that includes a negative susceptance at the $2F_0$ cold point of the device 500. More specifically, output impedance matching circuit 530 includes a first inductive element 532 (e.g., inductive element 432, FIG. 4), a first node 533 (e.g., node 433, FIG. 4) corresponding to the $2F_0$ cold point, a first LC circuit that includes a second inductive element 536 (e.g., inductive element 436, FIG. 4) and a first capacitor 538 (e.g., capacitor 438, FIG. 4) coupled in series, a second LC circuit that includes a third inductive element 540 (e.g., inductive element 440, FIG. 4) and a second capacitor 542 (e.g., capacitor 442, FIG. 4) coupled in series, and a second node 541 (e.g., node 441, FIG. 4) corresponding to an $F_0$ cold point of the device 500. According to the illustrated embodiment, the first and second capacitors 538, 542 are implemented in a single discrete device 537. In an alternate embodiment, the first and second capacitors 538, 542 may be implemented in separate discrete devices.

The first inductive element 532 is implemented in the form of a plurality of wirebonds, which electrically connect drain terminal 524 of transistor die 520 to the first node 533, or the $2F_0$ cold point of the device 500. In the embodiment of FIG. 5, the first node 533 is on the output lead 504. As explained above in conjunction with FIG. 4, both the first and second LC circuits are coupled between the $2F_0$ cold point (i.e., first node 533) and the voltage reference of the device (e.g., the substrate 501).

According to an embodiment, the first LC circuit (i.e., the series combination of the second inductive element 536 and capacitor 538) is coupled to the $2F_0$ cold point corresponding to first node 533. The second inductive element 536 is implemented in the form of a plurality of wirebonds, which electrically connects node 533 to the first capacitor 538. Capacitor 538 may be an IPD, a MOSCAP, a discrete ceramic capacitor, or another type of capacitor, in various embodiments. The second inductive element 536 is coupled to a first electrode of capacitor 538 through a conductive top contact of device 537, and the second electrode of capacitor 538 is electrically coupled to the voltage reference provided by the substrate 501 (e.g., the second electrode is grounded through the substrate 501).

Similarly, and according to an embodiment, the second LC circuit (i.e., the series combination of the third inductive element 540 and the second capacitor 542) also is coupled to the $2F_0$ cold point corresponding to first node 533. The third inductive element 540 is implemented in the form of a plurality of wirebonds, which electrically connects node 533 to the second capacitor 542. Capacitor 542 also may be an IPD, a MOSCAP, a discrete ceramic capacitor, or another type of capacitor, in various embodiments. The third inductive element 540 is coupled to a first electrode of capacitor 542 through a conductive top contact of device 537, and the second electrode of capacitor 542 is electrically coupled to the voltage reference provided by the substrate 501 (e.g., the second electrode is grounded through the substrate 501). The conductive contact on the top surface of capacitor 542 corresponds to node 541, or to an $F_0$ cold point of the device 500.

Although the details of the second amplifier path 552 are not discussed in detail herein, it can be noted that the second amplifier path also includes an input impedance matching circuit (e.g., including capacitor 515 and sets of wirebonds, not labeled, between input lead 503, capacitor 515, and transistor die 521), a transistor die 521, and an output impedance matching circuit (e.g., including IPD 543 with one or a plurality of integrated capacitors, and sets of wirebonds, not labeled, between transistor die 521, IPD 543, and output lead 505). The second amplifier path 552 and its associated input and output impedance matching circuits may have any of a number of configurations, only one of which is illustrated in FIG. 5.

According to an embodiment, both a positive susceptance and a negative susceptance at fundamental frequency $F_0$ are included in the carrier path circuitry at a node (e.g., node 233, 333, 433, 533, FIGS. 2-5) corresponding to the $2F_0$ cold point of the circuit. The positive susceptance is contributed by a first shunt circuit (referred to below as "positive susceptance shunt circuit"), and the negative susceptance is contributed by a second shunt circuit that is in parallel with the first shunt circuit (referred to below as "negative susceptance shunt circuit"). More specifically, according to various embodiments, the positive susceptance shunt circuit is series resonant at $2F_0$, and comprises the series combination of inductance 236, 336, 436, 536 and capacitance 238, 338, 438, 538. The negative susceptance shunt circuit is series resonant at sub-$F_0$, and comprises the series combination of inductance 240, 340, 440, 540 and capacitance 242, 342, 442, 542.

Figure 6:
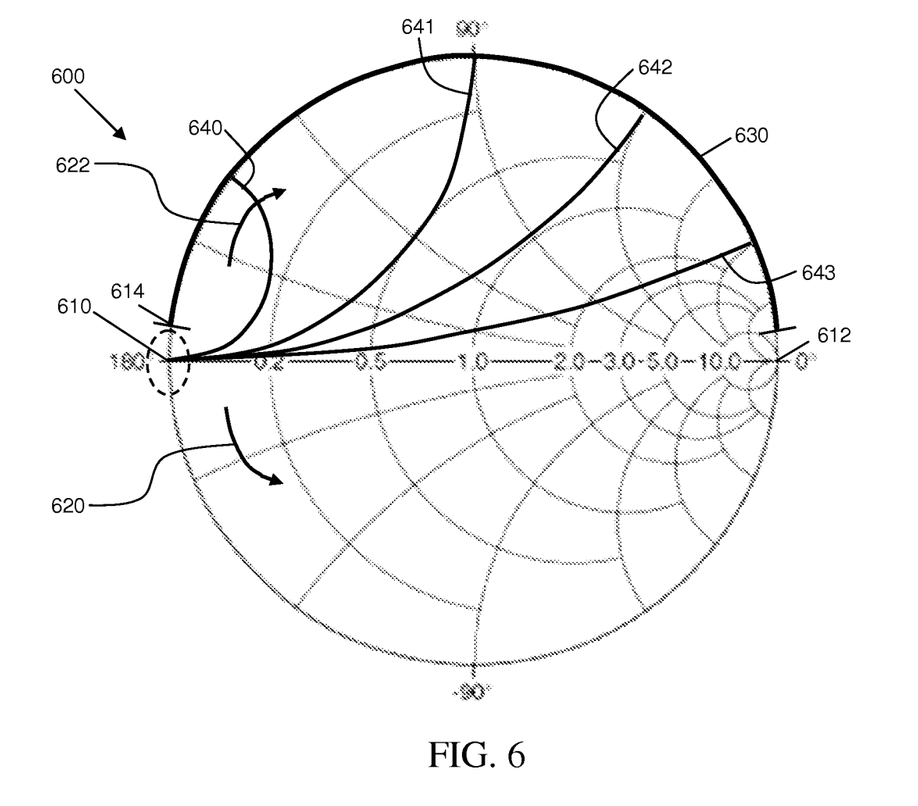
FIG. 6 is a Smith chart indicating characteristics of the output circuitry, in accordance with an example embodiment.

Referring to Smith Chart 600, the top half of the Smith Chart 600 corresponds to the region in which $F_0$ susceptance is negative, and the bottom half of the Smith Chart 600 corresponds to the region in which $F_0$ susceptance is positive. The positive susceptance shunt circuit, taken alone, is a $2F_0$ (short) at point 610. This same point 610 is a sub-fundamental resonance locus for the negative susceptance shunt circuit. Accordingly, at $F_0$, the positive susceptance shunt circuit elemental trajectory is located counter-clockwise (i.e., in direction 620), and below its $2F_0$ resonance point, having not yet reached resonance. This is in the lower half of Smith Chart 600, and thus corresponds to a positive susceptance at $F_0$. This positive susceptance is undesirable, and impairs performance of the circuit. According to an embodiment, the negative susceptance shunt circuit mitigates the impairment at the frequencies at which it occurs (or as close as possible thereto). More specifically, the negative susceptance shunt circuit elemental trajectory is located clockwise from its sub-$F_0$ resonant point 610 (i.e., in direction 622), which counteracts the counter-clockwise elemental trajectory of the positive susceptance shunt circuit. Because the negative susceptance shunt circuit is series resonant below $F_0$ (corresponding to the left side of Smith Chart 600), at $F_0$ the negative susceptance shunt circuit elemental response is positioned additionally clockwise on Smith Chart 600, putting the $F_0$ affect provided by the negative susceptance shunt circuit in the upper half of the Smith Chart 600 (i.e., in the portion of the Smith Chart 600 corresponding to negative susceptance). Trace 630 illustrates how this branch will broadly move with frequency from DC, at point 612, to the sub $F_0$ series resonant frequency, at point 614. $F_0$ lies in the range of trace 630. A measure of the negative susceptance imparted in a particular design may be taken from a reading of one of traces 640, 641, 642, 643 (or intermediate traces), each of which represents a discrete negative susceptance value. The sub $F_0$ resonance is a boundary condition that could, in theory, be very close to (but below) $F_0$. This would result in a very large negative susceptance (e.g., at point 614).

Embodiments of methods for fabricating a packaged RF device (e.g., RF devices 300, 500, FIGS. 3, 5) and an RF amplifier (e.g., Doherty amplifier 100, FIG. 1) now will be described. Although a single device may be fabricated in isolation, fabrication more typically will include producing multiple devices in parallel. Those of skill in the art would understand, based on the description herein, that fabrication may be performed using a leadframe that includes device substrates for multiple devices (e.g., in a strip or array format), and that multiple devices may be fabricated in parallel.

Figure 7:
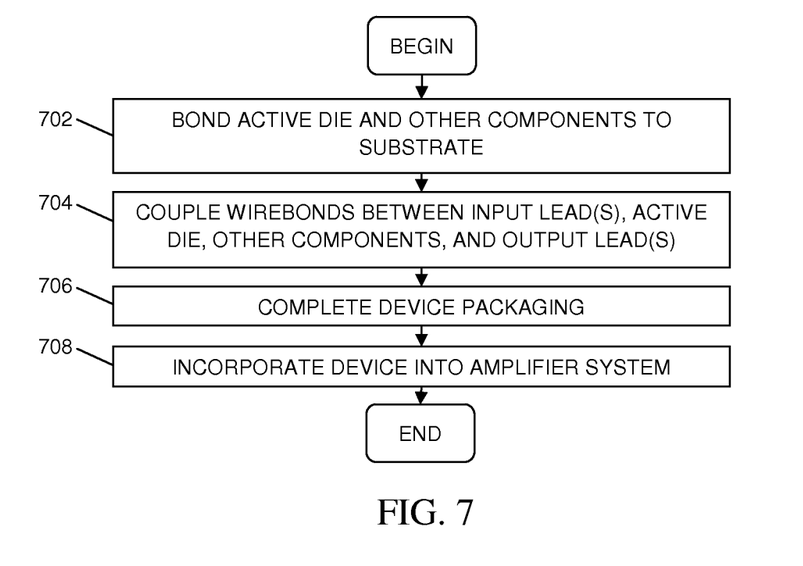
FIG. 7 is a flowchart of a method of manufacturing a packaged RF amplifier device, in accordance with an example embodiment.

FIG. 7 is a flowchart of a method of manufacturing a packaged RF amplifier device, in accordance with an example embodiment. In block 702, fabrication of a packaged RF amplifier device may include bonding one or more active die (e.g., die 320, 321, 520, 521) and other components (e.g., capacitors 314, 315, 338, 342, 343, 514, 515, 538, 542, 543 and inductor 336) to a top surface of a device substrate (e.g., substrate 301, 501). For example, the device substrate may form a portion of a leadframe, which also includes one or more input leads (e.g., input leads 302, 303, 502, 503) and one or more output leads (e.g., output leads 304, 305, 504, 505).

In block 704, fabrication of a packaged RF amplifier device continues by coupling inductive elements, in the form of sets of wirebonds (e.g., wirebonds 312, 316, 332, 334, 340, 512, 516, 532, 536, 540), between the input leads, the active die, the other components, and the output leads. Connection of the wirebonds essentially completes the formation of the amplifier path(s), including the input and output impedance matching circuits.

After attachment of the wirebonds, packaging of the partially-fabricated device may be completed in block 706. For example, when the device is embodied in an overmolded package, the active die, other components, wirebonds, portions of the input and output leads, and at least the top surface of the substrate are encapsulated with a non-conductive molding compound. Conversely, when the device is embodied in an air-cavity package, a lid may be applied over the active die, other components, wirebonds, portions of the input and output leads, and the top surface of the substrate, thus forming the air cavity.

The completed device then may be incorporated into an amplifier system in block 708. For example, the device may be incorporated into a Doherty amplifier (e.g., Doherty amplifier 100, FIG. 1). Alternatively, the device may be incorporated into another type of amplifier. Incorporation of the device into an amplifier system includes mounting the device on a PCB (or other substrate) so that the device substrate is electrically connected to the system's ground voltage reference. In addition, the device substrate may be mounted so that it is in contact with a heat sink, such as a conductive coin embedded within the PCB. The input leads are electrically coupled to conductors on the PCB that are configured to convey first and second input RF signals from upstream portions of the amplifier system (e.g., from signal splitter 170, FIG. 1). In addition, the output leads are electrically coupled to conductors on the PCB that are configured to convey amplified RF signals from the device to downstream portions of the amplifier system (e.g., to signal combiner 180, FIG. 1), including the load.

An embodiment of a packaged RF amplifier device includes input and output leads, a transistor that is characterized by a drain-source capacitance, and an inverse class-F circuit. The transistor has a control terminal coupled to the input lead, a first current carrying terminal coupled to a voltage reference, and a second current carrying terminal coupled to the inverse class-F circuit. The inverse class-F circuit is coupled between the second current carrying terminal and the output lead, and is configured to harmonically terminate the RF amplifier device. The inverse class-F circuit includes a first shunt circuit coupled between a first cold point node and the voltage reference. The first cold point node corresponds to a second harmonic frequency cold point for the RF amplifier device, and the first shunt circuit adds a shunt negative susceptance to the inverse class-F circuit.

An embodiment of an amplifier includes an amplifier path. The amplifier path includes an amplifier input node, an amplifier output node, a transistor, and an inverse class-F circuit. The transistor includes a control terminal and first and second current carrying terminals. The control terminal is coupled to the first amplifier input node, the first current carrying terminal is coupled to a voltage reference, the second current carrying terminal is coupled to the inverse class-F circuit, and the first transistor is characterized by a first drain-source capacitance. The inverse class-F circuit is coupled between the second current carrying terminal and the first amplifier output node and is configured to harmonically terminate the amplifier. The inverse class-F circuit includes a first shunt circuit coupled between a first cold point node and the voltage reference. The first cold point node corresponds to a second harmonic frequency cold point for the amplifier, and the first shunt circuit adds a shunt negative susceptance at a fundamental frequency $F_0$ to the inverse class-F circuit.

A method of manufacturing a packaged RF amplifier device includes coupling a transistor die to a top surface of a device substrate. The device substrate includes a voltage reference plane, the transistor die includes a control terminal and first and second current carrying terminals, and the first current carrying terminal is coupled to a voltage reference. The method also includes coupling the transistor control terminal to an input lead, and coupling an inverse class-F circuit to the device substrate between the second current carrying terminal and an output lead. The inverse class-F circuit is configured to harmonically terminate the RF amplifier device, and the inverse class-F circuit includes a first shunt circuit coupled between a first cold point node and the voltage reference. The first cold point node corresponds to a second harmonic frequency cold point for the RF amplifier device, and the first shunt circuit adds a shunt negative susceptance at a fundamental frequency $F_0$ to the inverse class-F circuit.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A packaged radio frequency (RF) amplifier device comprising:
    an input lead;
    an output lead;
    a first transistor that includes a control terminal and first and second current carrying terminals, wherein the control terminal is coupled to the input lead, the first current carrying terminal is coupled to a voltage reference, and the first transistor is characterized by a first drain-source capacitance; and
    an inverse class-F circuit coupled between the second current carrying terminal and the output lead and configured to harmonically terminate the RF amplifier device, wherein the inverse class-F circuit includes
        a first shunt circuit coupled between a first cold point node and the voltage reference, wherein the first cold point node corresponds to a second harmonic frequency cold point for the RF amplifier device, and wherein the first cold point node is located on a signal path between the second current carrying terminal and the output lead, and the first shunt circuit adds a shunt negative susceptance to the inverse class-F circuit at a fundamental frequency of the RF amplifier device, and
        a second shunt circuit coupled between the first cold point node and the voltage reference, wherein the second shunt circuit is resonant at the second harmonic frequency.

2. The packaged RF amplifier device of claim 1, wherein the first shunt circuit is resonant at a sub-fundamental frequency, which is a frequency that is lower than the fundamental frequency.

3. A packaged radio frequency (RF) amplifier device comprising:
    an input lead;
    an output lead;
    a first transistor that includes a control terminal and first and second current carrying terminals, wherein the control terminal is coupled to the input lead, the first current carrying terminal is coupled to a voltage reference, and the first transistor is characterized by a first drain-source capacitance; and
    an inverse class-F circuit coupled between the second current carrying terminal and the output lead and configured to harmonically terminate the RF amplifier device, wherein the inverse class-F circuit includes a first shunt circuit coupled between a first cold point node and the voltage reference, wherein the first cold point node corresponds to a second harmonic frequency cold point for the RF amplifier device, and the first shunt circuit adds a shunt negative susceptance to the inverse class-F circuit, wherein the inverse class-F circuit is configured to raise an impedance at the output lead to an impedance in a range of 5.0 Ohms to 15.0 Ohms when the amplifier device is under impedance modulation operation.

4. The packaged RF amplifier device of claim 1, wherein the inverse class-F circuit comprises:
    a first inductance coupled between the second current carrying terminal and the first cold point node, wherein a value for the first inductance is selected so that the first inductance and the first drain-source capacitance are resonant;
    the first shunt circuit, which includes a second inductance and a second capacitance coupled in series, and wherein values for the second inductance and the second capacitance are selected so that the first shunt circuit resonates at a sub-fundamental frequency, which is a frequency that is lower than the fundamental frequency; and
    the second shunt circuit, wherein the second shunt circuit includes a third inductance and a third capacitance coupled in series, and wherein values for the third inductance and the third capacitance are selected so that the second shunt circuit is resonant at the second harmonic frequency.

5. A packaged radio frequency (RF) amplifier device comprising:
    an input lead;
    an output lead;
    a first transistor that includes a control terminal and first and second current carrying terminals, wherein the control terminal is coupled to the input lead, the first current carrying terminal is coupled to a voltage reference, and the first transistor is characterized by a first drain-source capacitance; and
    an inverse class-F circuit coupled between the second current carrying terminal and the output lead and configured to harmonically terminate the RF amplifier device, wherein the inverse class-F circuit includes
        a first inductance coupled between the second current carrying terminal and a first cold point node, wherein a value for the first inductance is selected so that the first inductance and the first drain-source capacitance are resonant, and wherein the first cold point node corresponds to a second harmonic frequency cold point for the RF amplifier device,
        a first shunt circuit coupled between the first cold point node and the voltage reference, wherein the first shunt circuit adds a shunt negative susceptance to the inverse class-F circuit, and the first shunt circuit includes a second inductance and a second capacitance coupled in series, and wherein values for the second inductance and the second capacitance are selected so that the first shunt circuit resonates at a sub-fundamental frequency, which is a frequency that is lower than the fundamental frequency, a second cold point node between the second inductance and the second capacitance, wherein the second cold point node corresponds to a fundamental frequency $F_0$ cold point for the RF amplifier device, and a second shunt circuit coupled between the first cold point node and the voltage reference, wherein the second shunt circuit includes a third inductance and a third capacitance coupled in series, and wherein values for the third inductance and the third capacitance are selected so that the second shunt circuit is resonant at the second harmonic frequency.

6. The packaged RF amplifier device of claim 4, further comprising:
a fourth inductance coupled between the first cold point node and the output lead.

7. The packaged RF amplifier device of claim 4, wherein the first cold point node is on the output lead.

8. The packaged RF amplifier device of claim 1, wherein the first transistor is selected from a laterally diffused field effect transistor and a high electron mobility transistor.

9. The packaged RF amplifier device of claim 1, wherein the first transistor is a high electron mobility transistor that includes a gallium nitride semiconductor substrate.

10. The packaged RF amplifier device of claim 1, further comprising:
a second input lead;
a second output lead; and
a second transistor that includes a second control terminal and third and fourth current carrying terminals, wherein the second control terminal is coupled to the second input lead, the third current carrying terminal is coupled to the voltage reference, and the fourth current carrying terminal is coupled to the second output lead.

11. The packaged RF amplifier device of claim 10, wherein:
the first transistor is a carrier amplifier for a Doherty amplifier;
the second transistor is a peaking amplifier for the Doherty amplifier; and
the first and second transistors are asymmetrical.

12. The packaged RF amplifier device of claim 10, wherein:
the first transistor is a carrier amplifier for a Doherty amplifier;
the second transistor is a peaking amplifier for the Doherty amplifier; and
the first and second transistors are symmetrical.

13. An amplifier comprising:
a first amplifier path that includes
a first amplifier input node,
a first amplifier output node,
a first transistor that includes a control terminal and first and second current carrying terminals, wherein the control terminal is coupled to the first amplifier input node, the first current carrying terminal is coupled to a voltage reference, the second current carrying terminal is coupled to an inverse class-F circuit, and the first transistor is characterized by a first drain-source capacitance, and the inverse class-F circuit coupled between the second current carrying terminal and the first amplifier output node and configured to harmonically terminate the amplifier, wherein the inverse class-F circuit includes
a first shunt circuit coupled between a first cold point node and the voltage reference, wherein the first cold point node corresponds to a second harmonic frequency cold point for the amplifier, wherein the first cold point node is located on a signal path between the second current carrying terminal and the output node, and the first shunt circuit adds a shunt negative susceptance at a fundamental frequency $F_0$ to the inverse class-F circuit, and
a second shunt circuit coupled between the first cold point node and the voltage reference, wherein the second shunt circuit is resonant at the second harmonic frequency.

14. The amplifier of claim 13, wherein the first shunt circuit is resonant at a sub-fundamental frequency, which is a frequency that is lower than the fundamental frequency.

15. The amplifier of claim 13, wherein the inverse class-F circuit comprises:
a first inductance coupled between the second current carrying terminal and the first cold point node, wherein a value for the first inductance is selected so that the first inductance and the first drain-source capacitance are resonant;
the first shunt circuit, which includes a second inductance and a second capacitance coupled in series, and wherein values for the second inductance and the second capacitance are selected so that the first shunt circuit resonates at a sub-fundamental frequency, which is a frequency that is lower than the fundamental frequency; and
the second shunt circuit, wherein the second shunt circuit includes a third inductance and a third capacitance coupled in series, and wherein values for the third inductance and the third capacitance are selected so that the second shunt circuit is resonant at the second harmonic frequency.

16. The amplifier of claim 13, further comprising:
a second amplifier path that includes
a second amplifier input node,
a second amplifier output node,
a second transistor that includes a second control terminal and third and fourth current carrying terminals, wherein the second control terminal is coupled to the second amplifier input node, the third current carrying terminal is coupled to a voltage reference, and the fourth current carrying terminal is coupled to the second amplifier output node.

17. The amplifier of claim 16, wherein the first amplifier path is a carrier path of a Doherty amplifier, the second amplifier path is a peaking path of the Doherty amplifier, and the amplifier further comprises:
a splitter having a splitter input and first and second splitter outputs, wherein the first splitter output is coupled to the first amplifier input node, and the second splitter output is coupled to the second amplifier input node, and the splitter is configured to split an input signal received at the splitter input into first and second signals that are provided at the first and second splitter outputs to the first and second amplifier paths; and a combiner having a summing node and a combiner output, wherein the first and second amplifier output nodes are coupled to the summing node, and the summing node is configured to combine first and second amplified signals received from the first and second amplifier paths into a third amplified signal that is provided to a load coupled to the combiner output.

18. The amplifier of claim 17, wherein a total phase shift between the second current carrying terminal and the summing node is 90 degrees.

* * * * *